United States Patent [19]

Kaneko et al.

[11] 4,258,330
[45] Mar. 24, 1981

[54] DIFFERENTIAL CURRENT AMPLIFIER

[75] Inventors: Kenji Kaneko, Hachioji; Takahiro Okabe, Hinodemachi; Tohru Nakamura, Houya; Wasao Takasugi, Higashiyamato; Minoru Nagata, Kodaira, all of Japan

[73] Assignee: Hitachi, Ltd., Japan

[21] Appl. No.: 12,028

[22] Filed: Feb. 14, 1979

[30] Foreign Application Priority Data

Feb. 15, 1978 [JP] Japan .............................. 53-17158[U]

[51] Int. Cl.$^3$ .............................................. H03F 3/45
[52] U.S. Cl. ................................ 330/257; 307/299 B; 307/355; 330/288
[58] Field of Search ............................... 330/257, 288; 307/299.3, 355; 357/92

[56] References Cited

U.S. PATENT DOCUMENTS 3,927,331  12/1975  Nakashima et al. ............. 330/252 X
4,140,920  2/1979   Dao et al. ..................... 307/299 B X Primary Examiner—James B. Mullins
Attorney, Agent, or Firm—Craig & Antonelli

[57] ABSTRACT

A differential amplifier circuit wherein one collector of the multicollector of each of first, second and third inverse NPN transistors is connected to a base of the corresponding transistor; the first and second transistors are used as differential input transistors; the other collector of each of the first and second transistors is connected to a PNP transistor serving as a load current source; and an output is derived through the third transistor connected to the second transistor.

15 Claims, 13 Drawing Figures

DIFFERENTIAL CURRENT AMPLIFIER

BACKGROUND OF THE INVENTION

(1) Field of the Invention

This invention relates to a current comparison type differential amplifier. More particularly, it relates to a differential amplifier employing current-mirror circuits which are composed of NPN transistors that are operated in the inverse mode (hereinbelow, simply termed "inverse NPN transistors") or which are composed of integrated injection logic (hereinafter, abbreviated to "I²L").

(2) Description of the Prior Art

Figure 1A:
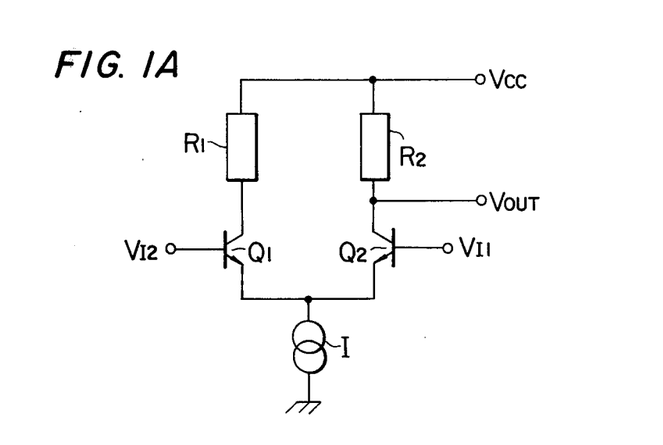
FIG. 1A is a schematic circuit diagram showing a prior-art differential amplifier.

Differential amplifiers which have heretofore been known are circuits of the voltage comparison type which amplifies the voltage difference between two input signals. FIG. 1A of the accompanying drawings shows a prior-art differential amplifier.

As shown in the figure, the emitters of a pair of transistors $Q_1$ and $Q_2$ are connected in common and connected to a constant current source I. Since the constant current source I has a very high impedance, the respective transistors $Q_1$ and $Q_2$ effect the emitter-follower operation and their input impedances become very high. If the transistors $Q_1$ and $Q_2$ and loads $R_1$ and $R_2$ are chosen to be substantially identical respectively and input voltages $V_{I1}$ and $V_{I2}$ are equal voltages, currents to flow through the respective transistors $Q_1$ and $Q_2$ will become equal. If the input voltage $V_{I1}$ is greater than the input voltage $V_{I2}$, the current of the transistor $Q_1$ will become greater than that of the transistor $Q_2$. Since both the transistors have the emitters coupled and connected to the constant current source, the current increment of the transistor $Q_1$ and the current decrement of the transistor $Q_2$ become equal, and a voltage increment which is proportional to the current decrement of the transistor $Q_2$ appears in an output voltage $V_{out}$.

In this manner, the prior-art differential amplifier is such that since the input impedances are very high, the input currents are small, the output being provided by comparing the input voltages.

Figure 1B:
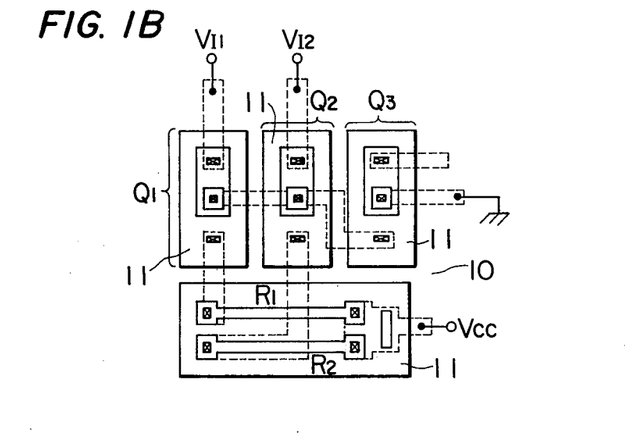
FIG. 1B is a layout pattern view when the differential amplifier of FIG. 1A is formed in an integrated circuit.

With the prior-art differential amplifier, the respective transistors and resistors need to be fabricated in an isolated manner within an integrated circuit. Usually, also the constant current source in FIG. 1A is an NPN transistor. An example of a layout pattern in the case of the differential amplifier of FIG. 1A within the integrated circuit is shown in FIG. 1B. As illustrated in FIG. 1B, the transistors $Q_1$ and $Q_2$ constituting the differential pair, the transistor $Q_3$ for the constant current source, and the resistors $R_1$ and $R_2$ must be formed in island regions 11 respectively enclosed with an isolation region 10. Therefore, the area which the differential amplifier occupies in the integrated circuit becomes large.

Figure 1C:
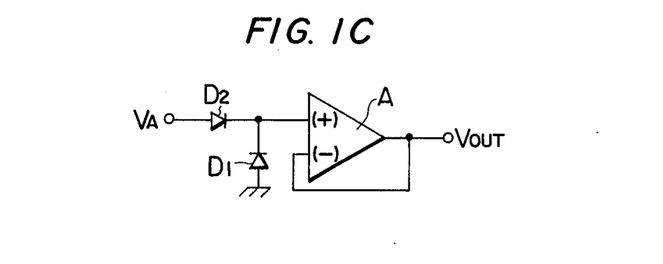
FIG. 1C is a schematic circuit diagram when an output current of a photocell is used as an input of the differential amplifier of FIG. 1A.

In the case where, as an application of the differential amplifier, a photocell is used for the input of the voltage comparison type differential amplifier, the circuit arrangement is as shown in FIG. 1C. Inputs (+) and (−) in FIG. 1C correspond to the inputs $V_{I1}$ and $V_{I2}$ in FIG. 1A. $D_1$ designates a diode being the photocell, which provides a current proportional to a quantity of light. $D_2$ designates a diode for converting into a voltage the current produced by the diode $D_1$.

When the optical input is feeble, the current of the diode $D_1$ naturally becomes very small, and it becomes 100 pA—several hundreds pA or so in some cases. Even under such a state, the differential amplifier indicated at A needs to effect a precise amplification in response to the input signal. The diode $D_1$ is connected in parallel between the input of the differential amplifier and the earth side. Therefore, if the current produced by the diode $D_1$ flows into the input side of the differential amplifier, precise amplification will be impossible. For this reason, a very great value is required for the impedance of the differential amplifier, and the specification of the input current needs to be several tens pA or less.

In the case where the prior-art differential amplifier is used together with an I²L, the signal levels of both the circuits are different, and hence, the output of the differential amplifier needs to be translated to the signal level of the I²L (or vice versa). In general, the output signal of the differential amplifier has a higher voltage level than the signal of the I²L. For the level translation, a level shift circuit is necessary besides the circuit shown in FIG. 1A, the circuit area increases still more.

SUMMARY OF THE INVENTION

This invention has for its object to make improvements in the prior-art differential amplifier including the problems described above.

An object of this invention is to provide a differential amplifier which has a simple circuit arrangement and which has a small circuit area in a semiconductor chip (IC chip or LSI chip).

Another object of this invention is to provide a differential amplifier which does not require a level translation for an I²L when it is used together with the I²L.

Still another object of this invention is to provide a current comparator type differential amplifier which can be constructed of only an I²L.

The differential amplifier of this invention is an amplifier wherein a plurality of current-mirror circuits are employed as current sources, they are combined to take the sum or difference of currents, and it is amplified.

DESCRIPTION OF THE PREFERRED EMBODIMENTS

Embodiment 1

Figure 2A:
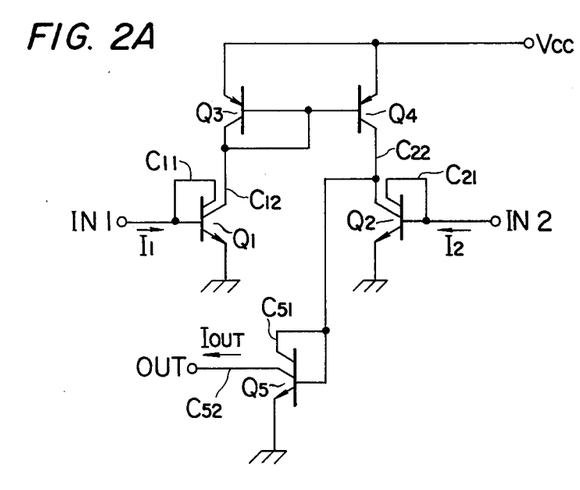
FIG. 2A is a schematic circuit diagram showing a differential amplifier which is a first embodiment of this invention.

FIG. 2A shows a first embodiment of the differential amplifier of this invention. As seen from the figure, the differential amplifier of the present embodiment is made up of NPN transistors $Q_1$, $Q_2$ and $Q_5$ each of which has a plurality of collectors and is operated in the inverse mode (hereinbelow, simply termed "inverse NPN transistor") and PNP transistors $Q_3$ and $Q_4$. The inverse NPN transistors $Q_1$, $Q_2$ and $Q_5$ have the first collectors $C_{11}$, $C_{21}$ and $C_{51}$ of the multi-collectors connected to the bases thereof and construct current-mirror circuits between them and the second collectors $C_{12}$, $C_{22}$ and $C_{52}$, respectively. The NPN transistors $Q_1$ and $Q_2$ are transistors for differential inputs, and the PNP transistors $Q_3$ and $Q_4$ to serve as current sources of loads are connected to the second collectors $C_{12}$ and $C_{22}$ of the respective transistors. Also the PNP transistors $Q_3$ and $Q_4$ construct a current-mirror circuit. IN1 and IN2 indicate base terminals of the NPN transistors $Q_1$ and $Q_2$ respectively, the base terminals being input terminals. An output current is derived from a terminal OUT of the second collector $C_{52}$ of the NPN transistor $Q_5$ whose base is connected to the second collector $C_{22}$ of the NPN transistor $Q_2$. In FIG. 2A, $V_{cc}$ indicates a power supply terminal.

In the circuit of FIG. 2A, an input current $I_1$ is applied to the input terminal IN1 and an input current $I_2$ is applied to the input terminal IN2. In the transistors $Q_1$ and $Q_2$, the ratio of a current to flow through the first collector connected to the base and a current to flow through the second collector is set at m. It is assumed that, in the transistor $Q_5$, the ratio of a current to flow through the first collector connected to the base and a current to flow through the second collector is set at n. At this time, the current of that second collector $C_{12}$ of the transistor $Q_1$ which is connected to the transistor $Q_3$ is m·$I_1$. Since the transistors $Q_3$ and $Q_4$ are also of the current-mirror circuit arrangement, the collector current of the transistor $Q_4$ becomes substantially m·$I_1$, too. On the other hand, the current of that second collector $C_{22}$ of the transistor $Q_2$ which is connected to the transistor $Q_4$ becomes m·$I_2$. Accordingly, a current to flow to the transistor $Q_5$ becomes m·($I_1 - I_2$). An output current $I_{OUT}$ of the transistor $Q_5$ is n times the current of the first collector $C_{51}$ connected to the base, so that it becomes:

$$I_{OUT} = m \cdot n \cdot (I_1 - I_2) \tag{1}$$

Accordingly, the current amplitude becomes:

$$A_I = I_{OUT}/(I_1 - I_2) = m \cdot n \tag{2}$$

As understood from Equation (1), the output current is obtained only when the input current $I_1$ is greater than the input current $I_2$. Accordingly, the present circuit is a differential amplifier circuit of the current comparison type.

The values m and n in Equation (2) can be arbitrarily set by varying the ratio between the area of the first collector connected to the base and the area of the second collector in the transistor $Q_1$, $Q_2$ or $Q_3$.

Figure 2B:
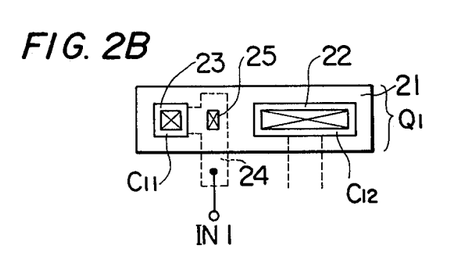
FIG. 2B is a layout pattern view of a transistor $Q_1$ when the differential amplifier of FIG. 2A is formed in an integrated circuit.

FIG. 2B shows an example of the layout pattern of the transistor $Q_1$. In the inverse NPN transistor, in case where the area of a base 21 is fixed and where the areas of collectors 22 and 23 are varied, the current gain is substantially proportional to the ratio between the collector area and the base area. In FIG. 2B, $S_{C1}$ is let denote the area of the collector $C_{11}$ connected to the base (an interconnection 24 is connected with the base at 25). The area of the other collector $C_{12}$ is denoted by $S_{C2}$. The base area is denoted by $S_B$. Then, the current gains $\beta_1$ and $\beta_2$ of the respective collectors $C_{11}$ and $C_{12}$ become:

$$\beta_1 = k(S_{C1}/S_B) \tag{3}$$

$$\beta_2 = k(S_{C2}/S_B) \tag{4}$$

where k is a proportional constant. Accordingly, letting $I_B$ denote the base current, currents $I_{C1}$ and $I_{C2}$ to flow through the respective collectors $C_{11}$ and $C_{12}$ become:

$$I_{C1} = \beta_1 I_B = k(S_{C1}/S_B)I_B \tag{5}$$

$$I_{C2} = \beta_2 I_B = k(S_{C2}/S_B)I_B \tag{6}$$

Therefore, the ratio of the currents of the collectors $C_{11}$ and $C_{12}$ becomes:

$$I_{C2}/I_{C1} = S_{C2}/S_{C1} = m$$

The ratio of the currents is proportional to the ratio of the collector areas. Thus, the value m can be set by varying the collector areas as desired.

Figure 2C:
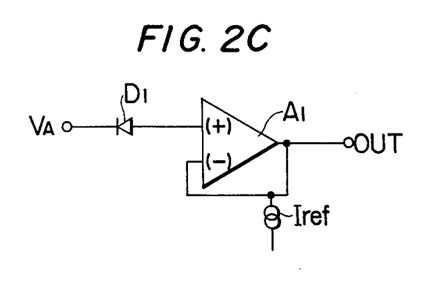
FIG. 2C is a schematic circuit diagram when a detection signal of a photocell is used as an input of the differential amplifier of FIG. 2A.

In case where a photocell is used for the current comparison type differential amplifier circuit shown in FIG. 2A, the photocell $D_1$ is incorporated in series with an input as shown in FIG. 2C. In FIG. 2C, the input (+) of the differential amplifier $A_1$ is the input IN2 in FIG. 2A, while an input (−) thereof is the input IN1. An output of the present circuit is connected to the input (−), and a reference current $I_{ref}$ is applied to this point. Then, when the input (+) (the input IN2) increases, the output current increases. In the case where the photocell is incorporated in series with the input as shown in FIG. 2C, all the photo current generated in the photocell $D_1$ by an optical input flows to the amplifier, and this current is amplified. Therefore, the leakage current as in the voltage comparison type differential amplifier circuit shown in FIG. 1C does not need to be considered.

In this manner, the current comparison type differential amplifier circuit is very effective when combined with the photocell.

Embodiment 2

Figure 3:
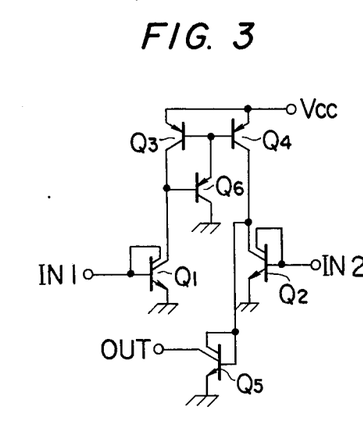
FIG. 3 is a schematic circuit diagram showing a differential amplifier which is a second embodiment of this invention.

FIG. 3 shows a second embodiment of this invention. This embodiment is such that the current-mirror circuit of the PNP transistors in FIG. 2A is precisely constructed. In general, a PNP transistor has a low current gain. Therefore, a difference develops between the current flowing on the collector side of the transistor $Q_3$ and the current flowing on the collector side of the transistor Q₄. In order to make the difference small, a transistor $Q_6$ is added. When the base of the transistor $Q_3$ is connected to the collector thereof as in the foregoing embodiment, the current at this point becomes the sum of the collector current and the base currents of the transistors $Q_3$ and $Q_4$. On the other hand, only the collector current flows on the collector side of the transistor $Q_4$. Accordingly, the currents on the collector sides of the transistors $Q_3$ and $Q_4$ have a difference corresponding to the base current component. When the transistor $Q_6$ is added as in the present embodiment, the base currents of the transistors $Q_3$ and $Q_4$ become the emitter current of the transistor $Q_6$, and the current on the collector side of the transistor $Q_3$ becomes the sum of the collector current of the transistor $Q_3$ and the base current of the transistor $Q_6$. Since the base current of the transistor $Q_6$ becomes approximately 1/(current gain) of the emitter current, the difference of the currents on the collector sides of the transistors $Q_3$ and $Q_4$ is very small.

Embodiment 3

Figure 4:
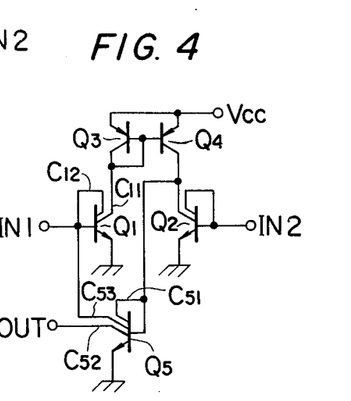
FIG. 4 is a schematic circuit diagram showing a differential amplifier which is a third embodiment of this invention.

FIG. 4 is a diagram showing a third embodiment of the differential amplifier of this invention.

This embodiment shown in FIG. 4 illustrates a method for applying negative feedback. A third collector $C_{53}$ is disposed in the NPN transistor $Q_5$ in FIG. 2A and is connected to the base of the NPN transistor $Q_1$, whereby the negative feedback can be applied. Letting l denote the ratio between the current sinking capability of the third collector $C_{53}$ connected to the base of the NPN transistor $Q_1$ and the current sinking capability of the second collector $C_{52}$ serving as the output terminal OUT, the current amplitude of the present circuit becomes:

$$A_I = \frac{I_{OUT}}{I_1 - I_2} = \frac{m \cdot n \cdot l}{1 + m \cdot n}$$

In this manner, the differential amplifier circuit according to this invention can freely set the quantity of negative feedback by varying the areas of the collectors of the NPN transistor.

Embodiment 4

Figure 5:
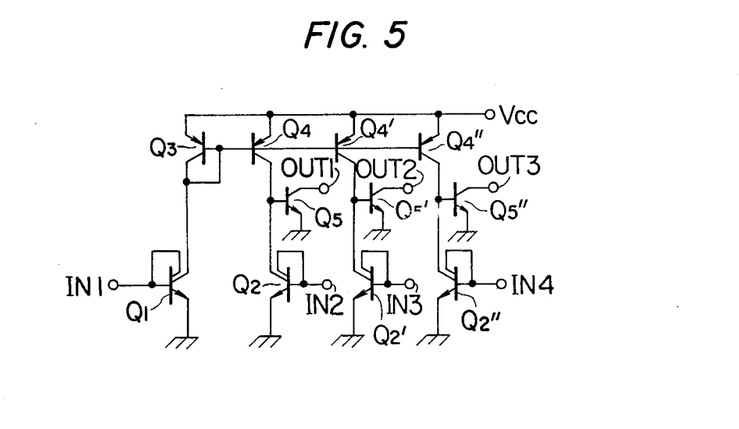
FIG. 5 is a schematic circuit diagram showing a differential amplifier of multiple inputs and outputs which is a fourth embodiment of this invention.

FIG. 5 shows a fourth embodiment of the differential amplifier according to this invention. The differential amplifier shown in FIG. 5 teaches an arrangement which has multiple inputs and outputs. NPN transistors $Q_2'$, $Q_2''$, $Q_5'$ and $Q_5''$ and PNP transistors $Q_4'$ and $Q_4''$ are added to the differential amplifier shown in FIG. 2A. An input current at the input terminal IN1 and input currents at input terminals IN2, IN3 and IN4 are compared, and output currents are derived from output terminals OUT1, OUT2 and OUT3.

Embodiment 5

Figure 6A:
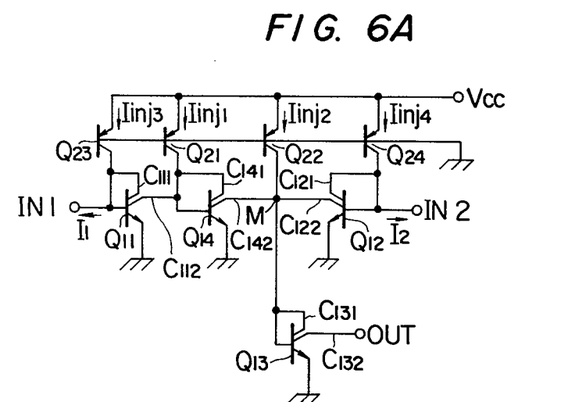
FIG. 6A shows a fifth embodiment of this invention, and is a schematic circuit diagram of a differential amplifier constructed of an I²L.

FIG. 6A shows a fifth embodiment of the differential amplifier of this invention. The differential amplifier shown in FIG. 6A teaches a construction which employs I²Ls. In the figure, $Q_{21}$, $Q_{22}$, $Q_{23}$ and $Q_{24}$ indicate lateral PNP transistors of the I²Ls, and they are used as common base circuits. $Q_{11}$, $Q_{12}$, $Q_{13}$ and $Q_{14}$ indicate inverse NPN transistors of the I²Ls, and they are of the current-mirror construction. The transistors $Q_{11}$ and $Q_{23}$, the transistors $Q_{13}$ and $Q_{22}$, the transistors $Q_{12}$ and $Q_{24}$ and the transistors $Q_{14}$ and $Q_{21}$ constitute the I²Ls, respectively.

The differential amplifier in FIG. 6A amplifies a current which is proportional to the difference between an input applied to an input terminal IN1 being the base terminal of the inverse NPN transistor $Q_{11}$ (current $I_1$ drawn out from the base of the transistor $Q_{11}$) and an input applied to an input terminal IN2 being the base terminal of the inverse NPN transistor $Q_{12}$ (current $I_2$ drawn out from the base of the transistor $Q_{12}$), and provides the amplified current from an output terminal OUT being the second collector terminal $C_{132}$ of the inverse NPN transistor $Q_{13}$. Supposing that the areas of the first and second collectors of the respective transistors $Q_{11}$, $Q_{12}$, $Q_{13}$ and $Q_{14}$ are equal and that injector current $I_{inj1} = I_{inj3}$, then the sinking current of the second collector $C_{142}$ of the inverse NPN transistor $Q_{14}$ is equal to the current $I_1$, the sinking current of the second collector $C_{122}$ of the inverse NPN transistor $Q_{12}$ is equal to $(I_{inj4} - I_2)$, and the sum of both these currents becomes $(I_{inj4} - I_2 + I_1)$. At a node H, an injector current $I_{inj2}$ and the sum $(I_{inj4} - I_2 + I_1)$ are compared. The difference of both these currents, $\{I_{inj2} - (I_{inj4} - I_2 + I_1)\}$ flows into the base of the inverse NPN transistor $Q_{13}$, and it is provided from the terminal OUT. Assuming here that injector current $I_{inj4}$ = injector current $I_{inj2}$, the output current becomes $I_2 - I_1$.

With the present circuit, the current amplitude can be increased by making the injector current $I_{inj2}$ high or by making the areas of the second collectors $C_{112}$, $C_{122}$, $C_{132}$ and $C_{142}$ of the transistors $Q_{11}$, $Q_{12}$, $Q_{13}$ and $Q_{14}$ larger than the areas of the first collectors $C_{111}$, $C_{121}$, $C_{131}$ and $C_{141}$.

Figures 6B, 7A, 7B:
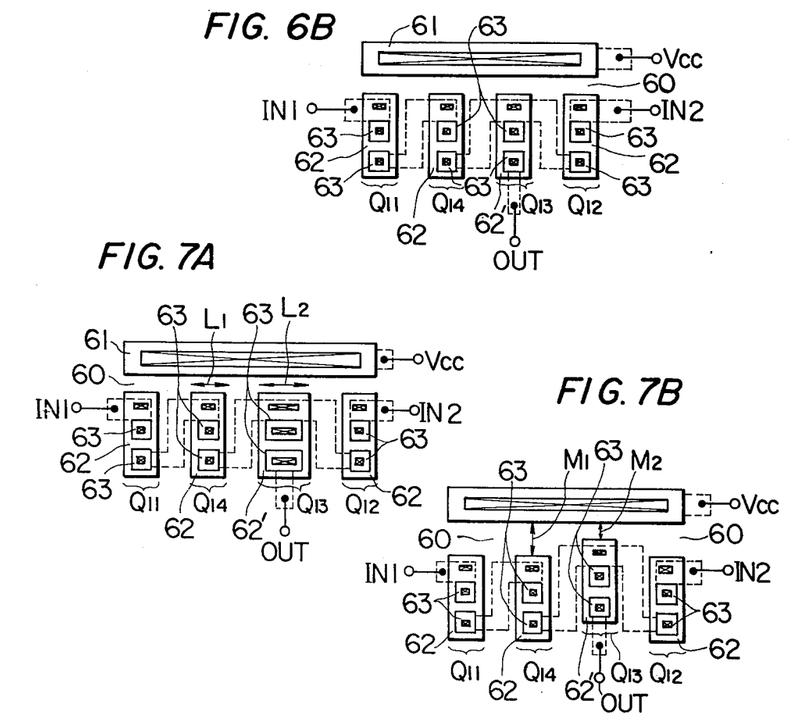
FIG. 6B shows a layout pattern view when the differential amplifier of FIG. 6A is formed in an integrated circuit.
FIGS. 7A and 7B are layout pattern views of integrated circuits for elucidating examples of the method of adjusting an injector current $I_{inj2}$ within the differential amplifier of FIG. 6A.

The layout pattern in an integrated circuit, of the differential amplifier of the I²L construction shown in FIG. 6A is illustrated in FIG. 6B. The pattern corresponds to a case where, in the circuit of FIG. 6A, the injector current $I_{inj1}$ = injector current $I_{inj2}$ = injector current $I_{inj3}$ = injector current $I_{inj4}$ and the areas of the respective collectors of the NPN transistors $Q_{11}$, $Q_{12}$, $Q_{13}$ and $Q_{14}$ are fixed (that is, m = n = 1). Referring to FIG. 6B, numeral 60 designates an N-type semiconductor (such as Si) body, numeral 61 an injector area (P-type region serving as the emitters of the lateral PNP transistors), and numerals 62 and 62' P-type regions serving both as the collectors of the lateral PNP transistors and as the base of inverse NPN transistors. Further, areas 63 indicate N-type regions which serve as the collectors of the inverse NPN transistors. Dotted lines indicate electrode interconnections, and marks X represent contact holes into the respective regions.

In FIGS. 6A and 6B, the injector currents $I_{inj1}$, $I_{inj2}$, $I_{inj3}$ and $I_{inj4}$, i.e., the emitter currents of the lateral PNP transistors $Q_{21}$, $Q_{22}$, $Q_{23}$ and $Q_{24}$ can be arbitrarily set by adjusting the lengths of opposition to the injectors.

FIG. 7A is a view illustrative of a layout pattern in the case of adjusting the currents by making different the length $L_1$ by which the base regions 62 of the transistors $Q_{11}$, $Q_{12}$ and $Q_{14}$ face the injector region 61 and the length $L_2$ by which the base region 62' of the transistor $Q_{13}$ faces the injector region 61. In this case, the length $L_2$ is selected to be 1.5 times the length $L_1$. The injector current $I_{inj2}$ and the injector currents $I_{inj1}$, $I_{inj3}$ and $I_{inj4}$ flow according to this ratio.

Likewise, a method as illustrated in FIG. 7B is possible for the adjustment of the injector currents. In this method, the distances $M_1$ and $M_2$ at which the bases of the transistors $Q_{11}$, $Q_{12}$ and $Q_{14}$ and the base of the transistor $Q_{13}$ face the injectors respectively are made unequal. Thus, the injector current $I_{inj2}$ can be made greater than the injector currents $I_{inj1}$, $I_{inj3}$ and $I_{inj4}$.

The integrated injection logic ($I^2L$) is described in, for example, the following literatures:

(1) K. Hart & A. Slob: Integrated Injection Logic—A New Approach to LSI, IEEE J. of SSC, sc-7, 5, pp. 346–351 (October 1972)

(2) H. H. Berger & S. K. Wiedmann: Merged Transistor Logic—A Low-Cost Bipolar Logic Concept, IEEE J. of SSC, sc-7, 5, pp. 340–346 (October 1972)

Embodiment 6

A circuit arrangement is also possible wherein, in the above embodiment, the collectors of the common-base PNP transistors are connected to the inputs IN1, IN2, . . . , and the emitters of the common-base PNP transistors are made inputs. In such a case, there is the advantage that the input impedance can be lowered because the PNP transistors are of the common-base type. These PNP transistors can be fabricated in quite the same way as that of the lateral PNP transistors of $I^2Ls$.

The advantages of the differential amplifier of this invention will be listed below.

(1) The differential amplifier of this invention is a differential amplifier circuit of the current comparison type as illustrated in FIG. 2A.

(2) The differential amplifier of this invention has a simple circuit arrangement. In particular, the circuit shown in FIG. 6A can be constructed of only $I^2Ls$, so that the circuit area becomes very small.

(3) The differential amplifier of this invention employs inverse NPN transistors used in $I^2Ls$ and common-base PNP transistors, and can be directly connected with ordinary $I^2Ls$ which effect logic operations.

(4) Being a differential amplifier of the current comparison type, the circuit. When used with a photocell as shown in FIG. 2C, the photocell can be incorporated in series with an input. Unlike the prior-art circuit, accordingly, the circuit of this invention does not need a high input impedance.

(5) The circuits in FIG. 2A, FIG. 4, FIG. 5 and FIG. 6A can operate with a supply voltage $V_{cc}$ of approximately 0.7 V, and the amplifier in FIG. 3 can operate with a supply voltage $V_{cc}$ of about 1.4 V.

(6) When inputs and outputs are made multiple as shown in FIG. 5, comparisons with currents of different levels can be carried out. This can be utilized as an A/D converter of the parallel comparison type.

(7) The quantity of feedback can be arbitrarily set by changing collector areas of an inverse NPN transistor.

The essentials of the construction of the differential amplifier of this invention will be listed below.

(1) A differential amplifier wherein a plurality of current sources are combined, and the sum or difference of currents is taken and amplified.

(2) A differential amplifier which employs current-mirror circuits as current sources.

(3) A differential amplifier wherein a circuit with one collector of an inverse PNP transistor connected to the base thereof is employed as a current-mirror circuit.

(4) A differential amplifier which employs the injector of an $I^2L$ circuit as a constant current source.

(5) A differential amplifier wherein, in a current-mirror circuit, the areas of the collectors of an inverse NPN transistor are made unequal to bestow a difference on the current sinking capabilities of the collectors.

(6) A differential amplifier wherein the lengths by which the bases of inverse NPN transistors face injectors are made unequal in order to make the current values of current sources unequal.

(7) A differential amplifier wherein common-base PNP transistors are disposed on the differential input sides, and the emitters of the PNP transistors are used as the inputs.

What is claimed is:

1. A differential current amplifier comprising:
a first inverse NPN transistor which has first and second collectors, whose first collector is electrically connected to a base thereof and whose emitter is electrically grounded,
a second inverse NPN transistor which has first and second collectors, whose first collector is electrically connected to a base thereof and whose emitter is electrically grounded,
a third inverse NPN transistor which has first and second collectors, whose first collector is electrically connected to a base thereof and whose emitter is electrically grounded,
a first input terminal which is the base terminal of said first inverse NPN transistor,
a second input terminal which is the base terminal of said second inverse NPN transistor,
an output terminal which is the second collector terminal of said third inverse NPN transistor, and
a constant current circuit which is electrically connected to said second collector of said first inverse NPN transistor, said second collector of said second inverse NPN transistor and said base of said third inverse NPN transistor,
a differentially amplified output current of input currents at said first and second input terminals being provided from said second collector of said third inverse NPN transistor as forms said output terminals, and wherein said constant current circuit comprises:
a first PNP transistor whose collector is electrically connected to said second collector of said first inverse NPN transistor and whose emitter is electrically connected to a power supply, and
a second PNP transistor whose collector is electrically connected to said second collector of said second inverse NPN transistor and a base of said third inverse NPN transistor, whose base is electrically connected to said base of said first PNP transistor and whose emitter is electrically connected to said power supply.

2. A differential current amplifier according to claim 1, further comprising a fourth inverse NPN transistor which has first and second collectors, whose first collector is electrically connected to a base thereof and whose emitter is electrically grounded, said base and said second collector of said fourth inverse NPN transistor being electrically connected to said second collector of said first NPN transistor and said collector of said second PNP transistor respectively.

3. A differential current amplifier according to claim 2, wherein:
said constant current circuit comprises first, second, third and fourth PNP transistors whose emitters are electrically connected to a power supply and whose bases are electrically grounded,
said collector of said first PNP transistor is electrically connected to said second collector of said first inverse NPN transistor, said collector of said second PNP transistor is electrically connected to said second collectors of said second and fourth inverse NPN transistors, said collector of said third PNP transistor is electrically connected to said base of said first inverse NPN transistor, and said collector of said fourth PNP transistor is electrically connected to said base of said second inverse NPN transistor.

4. A differential current amplifier according to claim 3, wherein said first inverse NPN transistor and said third PNP transistor, said second inverse NPN transistor and said fourth PNP transistor, said third inverse NPN transistor and said second PNP transistor, and said fourth inverse NPN transistor and said first PNP transistor constitute first, second, third, and fourth integrated injection logics, respectively.

5. A differential current amplifier according to claim 4, wherein injector current values of said first and fourth integrated injection logics are equal.

6. A differential current amplifier according to claim 5, wherein an injector current value of said third integrated injection logic is not smaller than an injector current value of said second integrated injection logic.

7. A differential current amplifier according to claim 2, 3, 4, 5 or 6, wherein an area of said second collector is larger than that of said first collector in at least one of said first, second, third and fourth inverse NPN transistors.

8. A differential current amplifier comprising:
a first inverse NPN transistor which has first and second collectors, whose first collector is electrically connected to a base thereof and whose emitter is electrically grounded, a second inverse NPN transistor which has first and second collectors, whose first collector is electrically connected to a base thereof and whose emitter is electrically grounded, a third inverse NPN transistor which has first and second collectors, whose first collector is electrically connected to a base thereof and whose emitter is electrically grounded, a first input terminal which is the base terminal of said first inverse NPN transistor, a second input terminal which is the base terminal of said second inverse NPN transistor, an output terminal which is the second collector terminal of said third inverse NPN transistor, and a constant current circuit which is electrically connected to said second collector of said first inverse NPN transistor, said second collector of said second inverse NPN transistor and said base of said third inverse NPN transistor, a differentially amplified output current of input currents at said first and second input terminals being provided from said second collector of said third inverse NPN transistor as forms said output terminal, wherein said third inverse NPN transistor has a third collector which is electrically connected to said base of said first inverse NPN transistor.

9. A differential current amplifier according to claim 1 or 8, wherein said collector and said base of said first PNP transistor are connected.

10. A differential current amplifier according to claim 9, wherein said collector and said base of said first PNP transistor are connected through a third PNP transistor whose collector is electrically grounded and whose base and emitter are electrically connected to said collector and base of said first PNP transistor respectively.

11. A differential current amplifier comprising:
a first inverse NPN transistor which has first and second collectors, whose first collector is electrically connected to a base thereof and whose emitter is electrically grounded, a second inverse NPN transistor which has first and second collectors, whose first collector is electrically connected to a base thereof and whose emitter is electrically grounded, a third inverse NPN transistor which has first and second collectors, whose first collector is electrically connected to a base thereof and whose emitter is electrically grounded, a first PNP transistor whose collector is electrically connected to said second collector of said first inverse NPN transistor and whose emitter is electrically connected to a power supply, a second PNP transistor whose collector is electrically connected to said second collector of said second inverse NPN transistor, whose base is electrically connected to a base of said first PNP transistor, and whose emitter is electrically connected to said power supply, means for supplying the base of said third inverse NPN transistor with a differential current which is equal to or less than a difference between a collector current $I_{c0}$ of said second PNP transistor and a current $I_{c2}$ of the second collector of said second inverse NPN transistor and which includes a difference between the current $I_{c1}$ of the second collector of said first inverse NPN transistor and the current $I_{c2}$, a first input terminal which is the base terminal of said first inverse NPN transistor, a second input terminal which is the base terminal of said second inverse NPN transistor, and an output terminal which is the second collecor terminal of said third inverse NPN transistor, a differentially amplified output current of input currents at said first and second input terminals being provided from said second collector of said third inverse NPN transistor as forms said output terminal.

12. A differential current amplifier according to claim 11, wherein the collector of said first PNP transistor is electrically connected to the base thereof so that the current $I_{c0}$ becomes substantially the current $I_{c1}$, and said differential current is a difference between the current $I_{c1}$ and the current $I_{c2}$.

13. A differential amplifier according to claim 11 further comprising:
a fourth inverse NPN transistor which has first and second collectors, whose first collector is electrically connected to a base thereof and whose emitter is electrically grounded, said base and said second collector of said fourth inverse NPN transistor being electrically connected to said second collector of said first NPN transistor and said collector of said second PNP transistor respectively, third and fourth PNP transistors whose emitters are electrically connected to said power supply and whose bases are electrically connected to the bases of said first and second PNP transistors, and wherein the bases of said first, second, third and fourth PNP transistors are electrically grounded, a collector of said third PNP transistor is electrically connected to the base of said first inverse NPN transistor, and a collector of said fourth PNP transistor is electrically connected to the base of said second inverse NPN transistor.

14. A differential current amplifier according to claim 13, wherein an area of said second collector is larger than that of said first collector in at least one of said first, second and third inverse NPN transistors.

15. A differential current amplifier according to claim 12, 13, 14, 2, 3 or 4, wherein collectors of fifth and sixth common-base PNP transistors whose emitters form input terminals are respectively connected to said first and second input terminals.

* * * * *